United States Patent [19]
Suzuki et al.

[11] Patent Number: 4,676,854
[45] Date of Patent: Jun. 30, 1987

[54] METHOD FOR SELECTIVELY BONDING SUBSTRATE HAVING FINE ELECTROCONDUCTIVE PATTERN

[75] Inventors: Tameyuki Suzuki, Zushi; Takuro Kamakura, Matsudo, both of Japan

[73] Assignee: Shinto Paint Co., Ltd., Amagasaki, Japan

[21] Appl. No.: 808,141

[22] Filed: Dec. 12, 1985

[30] Foreign Application Priority Data

Dec. 13, 1984 [JP] Japan ................... 59-263594

[51] Int. Cl.$^4$ .................. C25D 15/00; B32B 31/12
[52] U.S. Cl. ........................... 156/151; 204/15
[58] Field of Search ............ 156/150, 151; 204/15, 204/16; 252/511, 516, 520

[56] References Cited
U.S. PATENT DOCUMENTS 4,127,699 11/1978 Aumiller et al. ............ 252/516 X

FOREIGN PATENT DOCUMENTS 51-35416 10/1976 Japan ................... 156/150

Primary Examiner—Robert A. Dawson
Attorney, Agent, or Firm—Armstrong, Nikaido, Marmelstein & Kubovcik

[57] ABSTRACT

A method for selectively bonding a substrate having an electroconductive pattern to another substrate at selected portions of the pattern. An adhesive layer is formed on the selected portion of the pattern by the electrodeposition of a high molecular resin and the substrate is then bonded to the other substrate by means of the adhesive layer.

2 Claims, 2 Drawing Figures

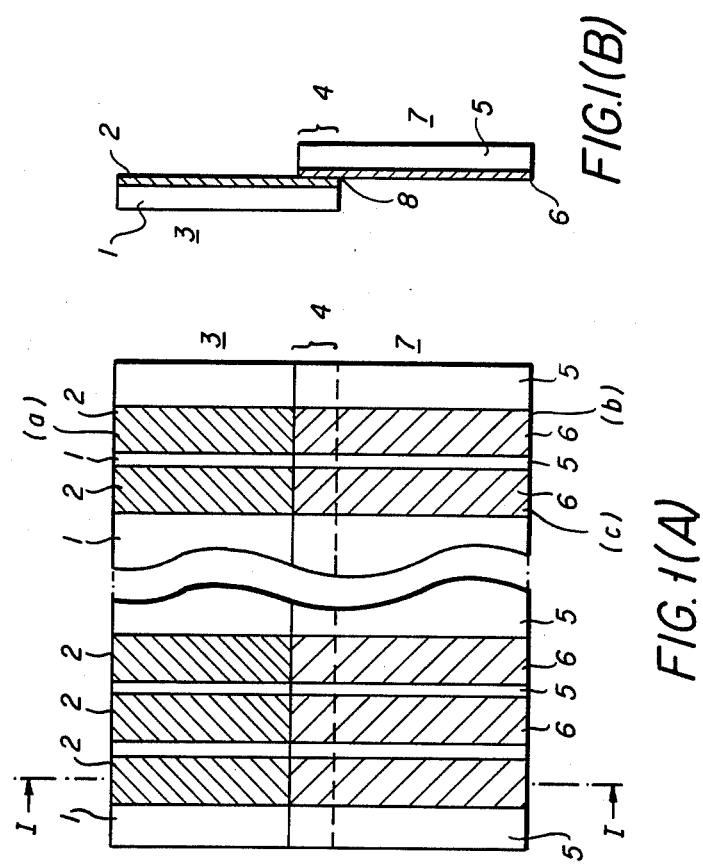

METHOD FOR SELECTIVELY BONDING SUBSTRATE HAVING FINE ELECTROCONDUCTIVE PATTERN

The present invention relates to a method for bonding a substrate having fine patterns, particularly a method for bonding a substrate having fine electroconductive patterns to other substrates at only the selected portion of said patterns. More particularly, the present invention relates to a method for bonding a substrate having very fine circuit patterns used in the field of the electronic industry to other substrates having for example electroconductive patterns, at only the selected portion of said circuit patterns.

With the recent progress of electronic parts, there is used a method of making fine patterns, for example fine circuit patterns, on a substrate and bonding only a mere part of the patterns to other substrates, for example, in such a manner that only a part of the fine circuit patterns is bonded to all or only a part of circuit patterns made on other substrates to make the bonded portion electroconductive. In this bonding method, electroconductive anisotropic adhesives are so far used. Electroconductive anisotropic adhesives now in use are a dispersion of electroconductive fine particles or fibers in an adhesive binder, or film-formed product of the dispersion. To impart electroconductivity to the bonded portion, there is a method of coating the dispersion onto the portions to be bonded together of substrates or inserting the film-formed product between the substrates and bonding the substrates together by pressing under heating to make only the direction of pressing electroconductive through the electroconductive particles or fibers (refer to for example Electronic Material, Vol. 22, No. 10, 50–54, 1983).

As an alternative method, there is well known a method of inserting an electroconductive rubber (zebra gum), produced by laminating electroconductive layers and insulating ones alternately, between the circuits to be bonded together and made electroconductive of two substrates, and applying pressure with heating to bond the substrates together whereby electroconductivity through both the circuits can be attained (refer to Technical bulletin on elastic connector, Toray Industries, Inc.).

But, these methods so far used have their respective defects. In the method with electroconductive anisotropic adhesives, electroconductivity should be produced only between the circuits to be bonded together, not between other circuits which should be electrically insulated from each other. For this purpose, it is necessary for the electroconductive particles or fibers contained in said adhesives to be completely and electrically disconnected and, when pressed under heating, electrically connected only both at the portion bonded together and in the direction of pressing. But, in bonding together circuits having very fine patterns or many complex patterns, it is difficult to clearly form completely electroconductive portions and insulating ones by operations such as coating, pressing, etc. Thus, the bonding becomes more difficult as the pattern becomes finer.

Also, in the method with the laminated electroconductive rubber (zebra gum), the production of zebra gum itself having a structure composed of very fine layers is difficult. There is a limit, therefore, to the fineness of patterns to be bonded together through zebra gum.

An object of the present invention is to provide a method for bonding a substrate having fine electroconductive patterns to other substrate at only the selected portion of the patterns with other portions of the patterns left surely unbonded.

Another object of the present invention is to provide a method for coating said selected portion only of the pattern with an electroconductive adhesive and bonding said portion to other substrates having preferably electroconductive patterns.

A further object of the present invention is to provide a method for bonding a substrate having fine circuit patterns to other substrates having circuit patterns at a definite selected portion of the former patterns and only a desired portion of the latter ones so that electroconductivity through the two portions can be attained.

According to the present invention, there is provided a method for selectively bonding a substrate having fine electroconductive patterns to other substrates at only the selected portion of said patterns which comprises forming an adhesive layer on said selected portion by electrodeposition coating of high molecular resins, followed by bonding to said other substrates.

As a material from which the substrate having fine electroconductive patterns used in the present invention is produced, there can be used flexible or rigid substrates such as films, sheets and plates made of synthetic resins and glass sheets. The electroconductive patterns usable include patterns such as printed circuits. The substrate having such fine electroconductive patterns includes the so-called PCB and FPC, etc. These substrates are well known, and so are their manufacturing methods.

As other substrates, which are to be bonded to the substrate having fine electroconductive patterns at the selected portion of the patterns, any of the foregoing substrates such as films, sheets and plates made of synthetic resins and glass sheets, will do. These substrates may have electroconductive patterns thereon, and in such case, electroconductivity through the patterns of the both substrates can be attained by bonding a part of the patterns to the selected portion of said electroconductive patterns.

As the electrodeposition coating of high molecular resins, as applied to form an adhesive layer on the substrate having electroconductive patterns, there can be used a method conventionally known as electrodeposition coating. This method permits the formation of an adhesive coating film (layer) having a very uniform thickness on the desired electroconductive pattern, and yet said coating film can be formed faithfully on said desired pattern only.

The high molecular resin adhesive used in the present invention includes the so-called anionic and cationic high molecular resins. These resins are available in three types, i.e. water-soluble, water-dispersible and latex types, and any of these types may be used. These resins include well-known epoxy resins, urethane resins, acrylic resins, polyester resins, polybutadiene resins, synthetic rubber resins, etc. When these resins are used in the anionic type, they are made water-soluble by introducing a carboxylic group into them or dispersed in water with anionic surface active agents. When they are used in the cationic type, they are made water-soluble by introducing an amino group into them or dispersed in water with cationic surface active agents.

When it is desired to make the foregoing adhesive layer electroconductive, it suffices to incorporate electroconductive fine particle-form material in the foregoing high molecular resins. Such electroconductive fine particle-form material includes graphite, carbon black; various metallic fine particles (e.g. gold, silver, nickel, copper); and ceramic electroconductive fine particles (e.g. titanium nitride, titanium carbide). These fine particles may be used alone or in mixture of two or more of them. The amount of the electroconductive fine particle-form material may optionally be changed depending upon a degree of electroconductivity desired for the adhesive layer, but generally, it is in the range of 20 to 90 wt. % of the solid content of the adhesive layer. Of these electroconductive fine particle-form materials, the ceramic fine particles such as titanium nitride and titanium carbide are particularly preferred because of their excellent chemical stability.

A preferred method for producing the electroconductive adhesive is as follows: The electroconductive fine particle is dispersed in an adhesive high molecular resin solution previously adjusted to a proper viscosity with water or, in some cases, a solvent by the well-known method using roll mills, pebble mills, sand grind mills, etc.

In the present invention, the following method is used to form the adhesive layer on only the selected portion of said fine electroconductive patterns made on a substrate by electrodeposition coating of high molecular resins.

In an electrodeposition bath comprising an electrodepositable adhesive high molecular resin, water and if necessary a little organic solvent, various additives (e.g. coloring agents) if necessary and the electroconductive fine particle-form material, are placed a substrate having electroconductive patterns on which the (electroconductive) adhesive layer is to be formed and a counter electrode, and direct current voltage is applied between the selected portion of said electroconductive patterns and the counter electrode.

In this case, when the adhesive high molecular resin is of an anionic character, direct current voltage is applied with said substrate (hereinafter referred to as substrate to be bonded together) as a positive electrode and the counter electrode as a negative electrode. When said adhesive high molecular resin is of a cationic character, the signs of the electrodes are reversed.

As a condition for electrodeposition, it is generally good to apply current for 1 to 60 seconds at 5 to 300 volts to electrodeposit an adhesive layer of about 1 to about 20μ in dry thickness. As to the thickness of the adhesive layer, it is desirable to properly determine depending mainly upon the degree of fineness of the electroconductive pattern of the substrate to be bonded together, which can be attained by controlling the aforementioned electrodeposition condition. Generally, the finer the electroconductive pattern, the thinner the thickness of the adhesive layer should be. As described later, this is desirable to prevent the adhesive layer from being pushed out laterally when other substrate has been pressed against the layer.

After the adhesive layer has been formed, as described above, on the desired portion of the electroconductive pattern of the substrate to be bonded together, the substrate is well washed with pure water, etc. to thoroughly wash off the adhesive which has simply adhered to portions other than the electrodeposited portion.

Thereafter, the substrate having the electrodeposited adhesive layer and another substrate are bonded together by applying heat and pressure under a bonding condition for the high molecular resin constituting the adhesive layer. Prior to the bonding, it is preferred to thoroughly remove volatile liquids (e.g. water, organic solvent) or gases contained in the adhesive layer. This removal can be attained by heating the washed substrate above in a vacuum heating chamber under a condition wherein no curing of the high molecular resin occurs, for example at a temperature lower than the curing temperature of the resin.

In bonding another substrate to the electroconductive pattern electrodeposition-coated with the adhesive layer by applying pressure, the high molecular resin contained in the layer should be heated to a temperature suited to it. When the resin is a thermoplastic one, bonding is carried out at a temperature at which the resin melts to some degree to give a good bonding strength, and when the resin is a thermosetting one, bonding is carried out under the curing condition for the resin.

According to the method of the present invention as described above, the adhesive layer can be applied easily and precisely to a substrate having fine electroconductive patterns at only the particular portion to be bonded together of the patterns. When another substrate is pressed against this substrate, it can be bonded to that particular portion only of the patterns. Consequently, if the adhesive layer is composed of an electroconductive adhesive, the substrate having the electroconductive pattern is for example FPC and another substrate is for example PCB, the desired circuits only of both FPC and PCB can electrically be connected with ease and precision.

The present invention will be further explained below by referring partly to the accompanying drawings wherein FIG. 1(A) is a plan view of a circuit board prepared in accordance with the present invention and FIG. 1(B) is a sectional view taken along line I—I in FIG. 1(A).

EXAMPLE 1

(1) A circuit plate 3 was prepared as follows: Copper was deposited on a polyimide flexible substrate 1 by vapor-deposition, and a large number of copper circuits 2 of 150μ in width were prepared on the substrate at intervals of 40μ by etching.

(2) An electrodeposition bath containing an electroconductive adhesive was prepared so as to have the following composition:

|  | Parts by weight |
|---|---|
| Anionic polybutadiene resin solution (product of Shinto Paint Co., Ltd.; ethyl cellosolve/diacetone alcohol solution having a solid content of 78 wt. %) | 50 |
| Nickel powder (product of INCO Co.; average particle diameter, 2-3μ) | 160 |
| Ethyl cellosolve | 40 |
| Triethylamine | 3 |
| Deionized water | 747 |
| Total | 1000 |

The resin solution and nickel powder were mixed, and the viscosity of the mixture was properly adjusted with addition of a part of ethyl cellosolve. The mixture was kneaded on a pebble mill for 8 hours to disperse the nickel powder in the resin solution. Thereafter, triethylamine and the residual ethyl cellosolve were added and well mixed to neutralize the resin, and the deionized water was added to prepare an electrodeposition bath having a solid content of 20 wt. %.

(3) The electrodeposition bath prepared in (2) was added to a glass beaker and kept at 25° C. with thorough stirring.

The circuit plate 3 prepared in (1) was previously masked with a tape so that the portion of every circuit extending 5 mm from the edge of the plate 3 remained exposed (shown by 4 in FIG. 1). This plate 3 and a stainless steel counter electrode having almost the same area as that of the plate 3 were dipped in the electrodeposition bath prepared above so that the both faced each other at a distance of 3 cm. With every copper circuit 2 on the circuit plate 3 as a positive electrode and the other as a negative electrode, a direct current of 50 V was applied for 20 seconds across the electrodes to electrodeposit an adhesive layer on only the portion 4 (5 mm long) of every copper circuit 2. The circuit plate 3 was taken out of the bath, and after removing the masking tape, washed with deionized water. Water and the solvent were then removed from the electrodeposited adhesive layer at 60° C. under reduced pressure. The thickness of the layer was 10μ.

(4) Separately, a glass cloth substrate 5 impregnated with an epoxy resin was treated in the same manner as in (1) to prepare a circuit plate 7 having copper circuits 6 of 150μ in width at intervals of 40μ.

(5) The circuit plate 7 prepared in (4) was placed on the circuit plate 3 having the adhesive layer 8 electrodeposited in (3) on only the portion 4 of 5 mm long of every copper circuit 2 so that each circuit 6 of the former 7 and each circuit 2 of the latter 3 overlapped each other at only the portion 4 of 5 mm long through the adhesive layer 8 [refer to FIG. 1(B)]. Both the circuit plates 3 and 7 were then bonded together by applying a pressure of 20 kg/cm² at 180° C. for 5 minutes.

(6) Electroconductivity and insulation between the bonded circuits on the circuit plates 3 and 7 were evaluated as follows: Resistance between (a) and (b) as well as (a) and (c) shown in FIG. 1(A) was measured by means of a digital multimeter (TR-6840; product of Takeda Riken Co.) in order to know the degree of electroconductivity through (a) and (b) and that of insulation between (a) and (c).

Resistance through (a) and (b): 5Ω
Resistance between (a) and (c): more than 10⁷Ω
There was no electric short between the circuits.

EXAMPLE 2

In Example 1, the adhesive layer 8 was electrodeposited on the copper circuit 6 of the circuit plate 7 prepared in (4), and the circuit plate 3 prepared in (1) was bonded to the circuit 6 in the same manner as in Example 1. The same test result as in Example 1 was obtained.

EXAMPLE 3

(1) A circuit plate 3 was prepared as follows: Silber paste circuits 2 of 100μ in width were prepared on a polyethylene terephthalate film substrate 1 at intervals of 50μ by screen-printing.

(2) An electrodeposition bath containing an electroconductive adhesive was prepared so as to have the following composition:

| | Parts by weight |
|---|---|
| Cationic urethane-modified epoxy resin solution (product of Shinto Paint Co., Ltd.; ethyl cellosolve/toluene solution having a solid content of 75 wt. %) | 67.0 |
| Titanium carbide powder (product of Nihon Shinkinzoku Co.; average particle diameter, 1μ) | 150.0 |
| Ethyl cellosolve | 33.0 |
| Acetic acid (50% aqueous solution) | 4.6 |
| Deionized water | 745.4 |
| Total | 1000.0 |

The resin solution and titanium carbide were mixed, and the viscosity of the mixture was properly adjusted with addition of a part of ethyl cellosolve. The mixture was kneaded on a sand grind mill for 1 hour to disperse the titanium carbide in the resin solution. Thereafter, acetic acid and the residual ethyl cellosolve were added and well mixed, and the deionized water was then added to prepare an electrodeposition bath.

(3) Using the bath prepared in (2), the adhesive layer 8 was electrodeposited on only the portion 4 of 5 mm long of every circuit 2 on the circuit plate 3 [prepared in (1)] according to the method of (3) in Example 1.

In this electrodeposition, however, the circuit plate 3 was a negative electrode; the counter electrode was a positive electrode; the distance between the electrodes was 10 cm; and a direct current of 60 V was applied for 10 seconds. The circuit plate 3 was then taken out of the bath and thoroughly washed with deionized water. Water and the organic solvent were then removed at 60° C. under reduced pressure from the adhesive layer 8 electrodeposited on the portion 4 of 5 mm long of every circuit 2. The thickness of the layer was 5μ.

(4) Separately, a circuit plate 7 was prepared as follows: Electroconductive tin oxide circuits 6 of 80μ in width were formed on a glass substrate 5 at intervals of 70μ according to the chemical vapor-deposition method.

(5) The circuit plate 7 prepared in (4) was placed on the circuit plate 3 having the electroconductive adhesive layer 8 electrodeposited in (3) so that each circuit 6 of the former plate 7 and each circuit 2 of the latter plate 3 overlapped each other at only the portion 4 of 5 mm long through the adhesive layer 8. Both the circuit plates were bonded together by applying a pressure of 5 kg/cm² at 200° C. for 5 minutes.

(6) In the same manner as in (6) in Example 1, electroconductivity and insulation between the circuits were measured to obtain the following result.

Resistance of electroconductivity: 500Ω
Resistance of insulation: more than 10⁷Ω
There was no electric short between the circuits.

EXAMPLE 4

In Example 3, the adhesive layer 8 of 5μ in thickness was electrodeposited on the tin oxide circuit prepared in (4) by applying a direct current of 50 V for 30 seconds according to the method of (3), and bonding was then carried out in the same manner as in (5). The same result as in Example 3 was obtained.

According to the method of the present invention, the following excellent effects are obtained: An adhesive layer can be formed easily and precisely on a substrate having fine electroconductive patterns at only a definite selected portion of said patterns; and said substrate can easily be bonded to another substrate (which may or may not be electroconductive) at only said definite selected portion through said adhesive layer.

What is claimed is:

1. A method for selectively bonding a substrate having fine electroconductive patterns to other substrates also having electroconductive patterns at only a selected portion of said patterns characterized in that an electroconductive adhesive layer is formed on said selected portion by electrodeposition coating of high molecular resins and then the subtrate is bonded to said other substrates.

2. A method as described in claim 1, wherein said electroconductive adhesive layer contains titanium carbide or titanium nitride.

* * * * *